United States Patent
Barber et al.

(10) Patent No.: US 6,673,708 B1
(45) Date of Patent: Jan. 6, 2004

(54) THERMAL AND MECHANICAL ATTACHMENT OF A HEATSPREADER TO A FLIP-CHIP INTEGRATED CIRCUIT STRUCTURE USING UNDERFILL

(75) Inventors: Ivor G. Barber, Los Gatos, CA (US); Zafer S. Kutlu, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/397,065

(22) Filed: Mar. 25, 2003

Related U.S. Application Data

(62) Division of application No. 09/872,327, filed on Jun. 1, 2001, now Pat. No. 6,590,292.

(51) Int. Cl.[7] .............................................. H01L 21/44
(52) U.S. Cl. ........................................ 438/608; 438/122
(58) Field of Search ................................ 438/108, 125, 438/118, 613, 117, 122, 106

(56) References Cited

U.S. PATENT DOCUMENTS

| | | | |
|---|---|---|---|
| 5,376,588 A | * | 12/1994 | Pendse |
| 5,696,027 A | * | 12/1997 | Crane, Jr. et al. |
| 5,952,726 A | * | 9/1999 | Liang |
| 5,977,622 A | * | 11/1999 | Mertol |
| 6,048,753 A | * | 4/2000 | Farnworth et al. |
| 6,064,113 A | * | 5/2000 | Kirkman |
| 6,111,756 A | * | 8/2000 | Morseco |
| 6,127,726 A | * | 10/2000 | Bright et al. |
| 6,198,635 B1 | * | 3/2001 | Shenoy et al. |

* cited by examiner

*Primary Examiner*—Roy Potter
(74) *Attorney, Agent, or Firm*—Conley, Rose & Tayon

(57) ABSTRACT

An integrated circuit structure and a method for packaging an integrated circuit are described. The integrated structure includes an integrated circuit that is inverted and solder bump mounted to a substrate. An underfill is used to encapsulate the solder bumps and form a rigid support layer between the integrated circuit and the substrate. A heatspreader, which has larger planar dimensions than the integrated circuit, is centrally attached to an upper surface of the integrated circuit with a thermally conductive material. Lateral portions of the heatspreader extending beyond the edges of the integrated circuit are attached to the substrate and sides of the integrated circuit by a thermally conductive underfill material. The thermally conductive underfill material thus employed, among other things, provides a robust mechanical support to the heatspreader and integrated circuit structure and eliminates the need for additional support structures such as conventional stiffener rings.

15 Claims, 2 Drawing Sheets

THERMAL AND MECHANICAL ATTACHMENT OF A HEATSPREADER TO A FLIP-CHIP INTEGRATED CIRCUIT STRUCTURE USING UNDERFILL

This is a divisional application from prior application Ser. No. 09/872,327 filed Jun. 1, 2001 now U.S. Pat. No. 6,590,292.

BACKGROUND OF THE INVENTION

1. Field of the Invention

This invention relates to integrated circuit packages, and more particularly, to improved methods for attaching a heatspreader to an integrated circuit mounted on a substrate.

2. Description of the Related Art

The following descriptions and examples are not admitted to be prior art by virtue of their inclusion within this section.

Until recently, the ongoing quest of the semiconductor industry to further improve the performance of integrated circuits (IC's) was little impacted by packaging. However, advancements in the performance of IC's are now being limited by the current packaging technology. Therefore, the efficient packaging of the IC's, e.g., increased package density or the miniaturization of packaging, will play an increasingly major role in the semiconductor industry.

There are several packaging technologies developed to connect IC's to a substrate, namely, wirebond, tape automated bonding (TAB), and flip-chip attach. The drive for faster clock speeds and more densely integrated circuits has led to integrated circuits that have a higher density of input/output (I/O) pads per chip. Flip-chip package technology such as direct chip attach (DCA), where the chip is directly attached to the board, has evolved to handle these higher I/O density chips providing manufacturing solutions such as: small package dimensions, high clock speed, low costs, and suitability for high volume production.

Instead of having the I/O pads on the periphery of the IC device as in the case, e.g., of wirebonded packaging, the I/O pads of an IC for a flip-chip application are typically arranged in a two-dimensional array upon a "frontside" surface of the IC. A flip-chip attachment method involves inverting the IC so that the "frontside" surface with I/0 pads faces downward on to a substrate such as a printed circuit board (PCB) or multichip module (MCM), which has corresponding set of bonding pads. A solder bump is formed upon each of the I/0 pads of the IC, and during the flip-chip mounting of the IC to the substrate, the solder bumps are placed into physical contact with the bonding pads of the substrate. The solder bumps are then subjecting to heating long enough for the solder to flow. When the solder cools and hardens, the I/O pads of the IC are electrically and mechanically coupled to the bonding pads of the substrate. This configuration is also referred to as a "die-down" configuration, since the IC, or die, is facing downward toward the substrate. In the case of a peripheral-terminal device, it would be mounted face upward, which is referred to as a "die-up" configuration, as in the case of wirebonding technology. "Die-up" mounting when compared to a "die-down" configuration may be more advantageous in some regards such as by allowing improved thermal contact between the IC and the grid array substrate. However, it appears less advantageous for packaging high density circuits that require a smaller area of substrate per IC chip, and faster (shorter path) electrical connections which have less resistance, and less parasitic inductance.

There are two principal thermal problems that must be addressed in a flip-chip or "die-down" configuration. One is mechanical strain on the solder bump attachments during temperature cycling due to the coefficient of thermal expansion (CTE) mismatch of the substrate with the IC. This problem has been effectively remedied by employing an underfill material, which is typically a thermosetting polymer (e.g., an epoxy resin) that is dispensed in liquid form between the IC and the substrate, and encapsulates the solder bumps. The liquid underfill material then becomes substantially rigid during a curing process, e.g., time and/or elevated temperature.

A second thermal problem that confronts flip-chip packaging is that it must provide an additional means for heat dissipation of the IC's during use, since the IC's are not as directly in contact with a substrate as in the "die-up" configuration. Typically, a heatspreader is a flat piece of copper or some other type of heat conducting material, which is attached by a thermosetting polymer (e.g., an epoxy resin) to the "backside" surface of the inverted IC. The typical heatspreader's lateral dimension is on the order of twice the size of the IC, and the heat it dissipates is about 5–30 watts per chip depending on the application.

One problem that arises when attaching a heatspreader to an IC is that since the heatspreader lateral dimensions will extend beyond the lateral sidewalls of the IC (i.e., the heatspreader is "oversized" in comparison with the IC), then the heatspreader can be susceptible to forces such as torque, which can put undue mechanical stress and strain on the attachments of the package. Typically, metal stiffener rings have been employed to alleviate any torque problems that may arise from attaching an "oversized" heatspreader to the back of a flip-chip attached IC. A stiffener ring is essentially a rectangular frame, though other shapes may be used, of copper or some other conducting material that laterally surrounds the IC. Typically, the stiffener ring is attached to the bottom surface of the outer edge of the heatspreader and the upper surface of the substrate by an attach epoxy. Therefore, the stiffener ring lends mechanical support to the lateral edges of the heatspreader, and remedies any undue torque problems that may result from the use of an "oversized" heatspreader in the IC package.

However, e.g., in the case of multichip module (MCM) packages where there are multiple IC's mounted onto a single module, the question of available space becomes very important for high density applications. In the case of a high density IC application there are several competing concerns. In general, one wants to make the individual "oversized" heatspreaders as large as possible to dissipate heat from the IC's. On the other hand, one wants to make the "oversized" heatspreaders as small as possible to save space and increase packing density, since the heatspreaders' lateral dimensions are a limiting factor in the available packaging surface area on the module substrate. In a typical configuration, some minimum amount of space is required to dispense the underfill around the IC, and also one must allow for some additional space for fillets of underfill on the edges of the IC that protrude outward, which add further support to the structure. Furthermore, there has to be minimum of space allotted for the placement of the stiffener rings with a stiffener ring adhesive and also for fillets at the sides of the stiffener ring that protrude outward and provide additional support. Also for purposes of maintaining mechanical integrity of the package structure typically one allows for some finite separation distance between the fillets on the sides of the IC and the fillets on the inner sides of the stiffener ring. In some high density applications there simply may not be enough space available on the module substrate to accommodate this type of heatspreader packaging configuration.

It would be beneficial to have a method for packaging an IC, which is flip-chip mounted to a substrate, by attaching a heatspreader to a flip-chip IC package without requiring the use of a stiffener ring between the heatspreader and the substrate, while still maintaining a robust mechanical support between the substrate and the heatspreader to eliminate any torque that may otherwise arise.

SUMMARY OF THE INVENTION

The problems outlined above may be in large part addressed by the present method for packaging an integrated circuit which is flip-chip mounted to a substrate, where the substrate may be, for example, a printed circuit board or alternatively a packaging substrate such as a multichip module substrate. In an embodiment, a first liquid encapsulant, preferably a thermosetting polymer such as an epoxy underfill, may be introduced on an upper surface of an IC, which is flip-chip mounted to a substrate. A heatspreader, having planar dimensions larger than the IC, is arranged over the IC and the first liquid encapsulant; where the lateral edges of the heatspreader extend beyond the lateral edges of the IC. Furthermore, the first liquid encapsulant is introduced between the lateral edges of the heatspreader and the substrate, where the first liquid encapsulant laterally surrounds the IC. Preferably, the first liquid encapsulant may include thermally conductive material. The first liquid encapsulant may also include electrically conductive material, and thus provide an effective grounding for the floating heatspreader. The first liquid encapsulant material may be subjected to a curing process, e.g., time and/or elevated temperature, which causes the encapsulant material to become substantially rigid, and thus form a reliable mechanical and thermal attachment of the heatspreader to the substrate.

In an embodiment, the heatspreader is attached to the integrated circuit with a thermally conductive material, preferably an adhesive epoxy. The thermally conductive material may be subjected to a curing process. In another embodiment, a second liquid encapsulant is introduced between the integrated circuit and the substrate. The second encapsulant material may be subjected to a curing process. The thermally conductive material, the first liquid encapsulant, and the second liquid encapsulant may be subjected to curing processes individually, or they may all be subjected to a single curing process together, or may be cured using two curing processes for the three thermosetting polymer materials.

In an embodiment, both the first liquid encapsulant and the thermally conductive material are of similar composition and may further have the same composition. In another embodiment, the first liquid encapsulant, the second liquid encapsulant, and the thermally conductive material are all of similar composition, and may further have the same composition.

In addition to the method discussed above, an integrated circuit structure is contemplated herein. In an embodiment the integrated circuit structure includes a heatspreader arranged over an integrated circuit flip-chip mounted to a substrate. A first continuous fill material, preferably an epoxy underfill, laterally surrounds the integrated circuit and extends vertically between the heatspreader and the substrate, such that the heatspreader is mechanically supported by the fill material. The first continuous fill material may include thermally conductive material. The first continuous fill material may also include electrically conductive material, and thus provide an effective grounding for the heatspreader.

In an embodiment, a thermally conductive material, preferably an adhesive epoxy, resides between the heatspreader and the integrated circuit. In another embodiment, a second continuous fill material, preferably an epoxy underfill, resides between the integrated circuit and the substrate.

In an embodiment, both the first continuous fill material and the thermally conductive material are of similar composition and may further have the same composition. In another embodiment, the first continuous fill material, the second continuous fill material, and the thermally conductive material are all of similar composition, and may further have the same composition.

BRIEF DESCRIPTION OF THE DRAWINGS

Other objects and advantages of the invention will become apparent upon reading the following detailed description and upon reference to the accompanying drawings in which.

Figure 1:
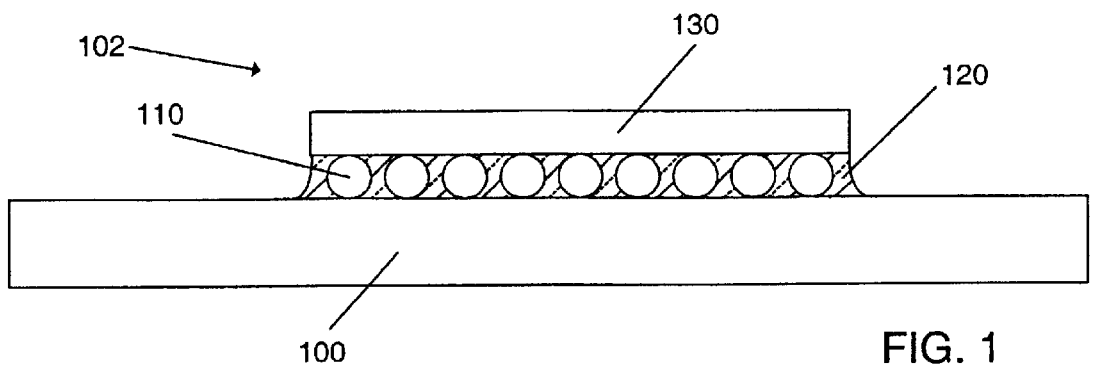
FIG. 1 is a cross-sectional view of an integrated circuit structure having an integrated circuit which is flip-chip mounted to a substrate, wherein a continuous fill material layer is formed between the integrated circuit and the substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
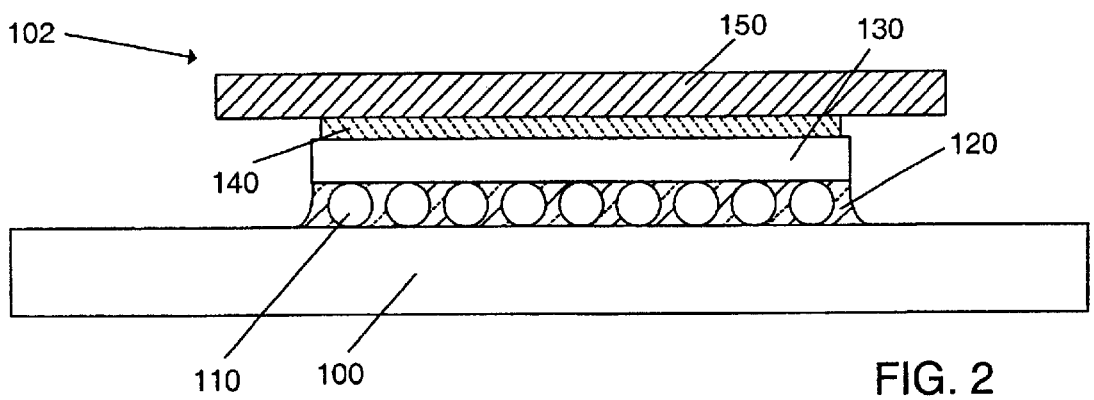
FIG. 2 is a cross-sectional view of the integrated circuit structure, wherein a heatspreader is attached to the back of the inverted integrated circuit by an attach epoxy.
Figure 3:
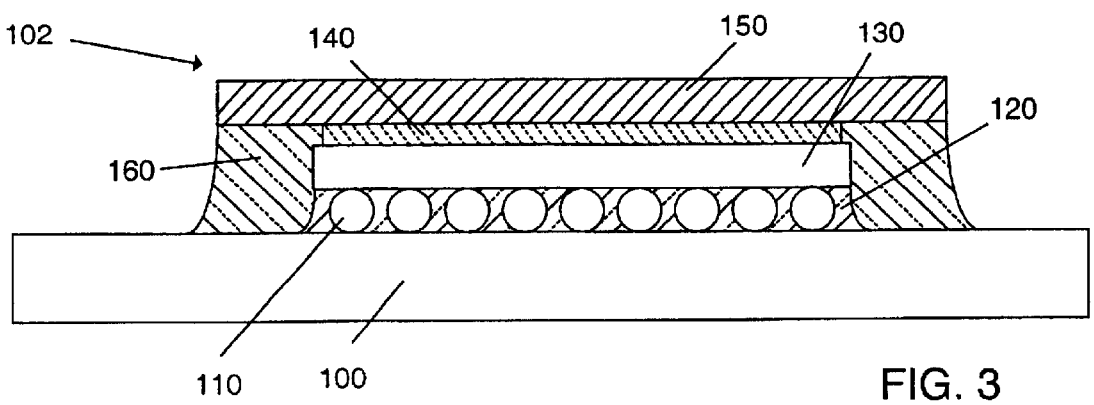
FIG. 3 is a cross-sectional view of the integrated circuit structure, wherein an additional continuous fill material layer is formed between the heatspreader and the substrate.
Figure 4:
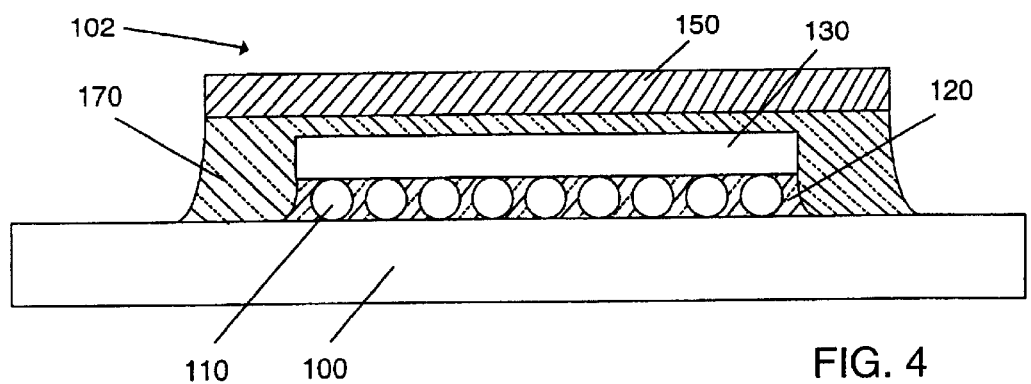
FIG. 4 is a cross-sectional view in an alternative embodiment of the integrated circuit structure, wherein a continuous fill material layer is used both between the central portion of the heatspreader and the inverted integrated circuit, and between lateral portions of the heatspreader and the substrate.
Figure 5:
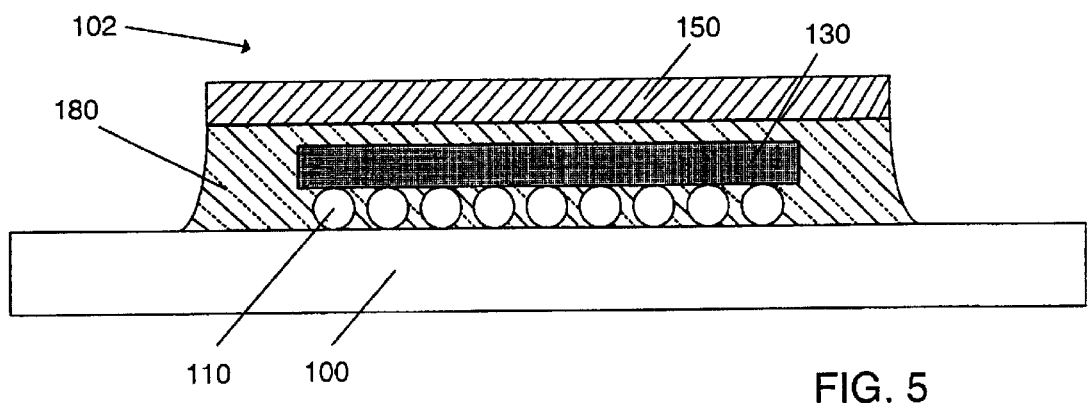
FIG. 5 is a cross-sectional view of in one embodiment of an integrated circuit structure, wherein a single continuous fill material layer is used between the integrated circuit and the substrate, between the central portion of the heatspreader and the back of the inverted integrated circuit, and between -lateral portions of the heatspreader and the substrate.

Turning to the drawings, exemplary embodiments of a method for packaging an integrated circuit which is flip-chip mounted to a substrate are shown in FIGS. 1–5, and embodiments of a resulting integrated circuit structure are shown in FIGS. 3–5.

FIG. 1 is a cross-sectional view of an integrated circuit structure 102 including an integrated circuit 130 flip-chip mounted to substrate 100. Substrate 100 may be, for example, a printed circuit board. Alternatively, substrate 100 may be a packaging substrate such as a ball grid array (BGA) substrate or a multichip module (MCM) substrate.

Integrated circuit 130 has a two dimensional array set of input/output (I/O) pads on its "frontside" surface, which is inverted in the flip-chip mounting process and faces the top surface of the substrate 100, which has a corresponding set of bonding pads. Both sets of connecting pads, which are not shown in the figures, are connected to each other by solder bumps 110. It should be noted that the actual shape of the solder bumps 110 may not be spherical as depicted in the FIGS. 1–5. A continuous fill material 120, preferably a thermosetting polymer such as an epoxy underfill, is formed between the integrated circuit 130 and substrate 100, where the fill material surrounds and encapsulates the solder bumps 110.

The continuous fill material 120 may be introduced as a liquid encapsulant along one or more sides of IC 130, and capillary action may be relied upon to draw the liquid encapsulant material into the region between the IC 130 and the substrate 100. The liquid encapsulant may then be subjected to curing process where over a period of time and/or elevated temperature the encapsulant hardens and becomes substantially rigid to provide mechanical support to the flip-chip IC 130. Due to the coefficient of thermal expansion (CTE) mismatch between IC 130 and substrate 100, the solder bumps 110 can experience significant stress and strain. The continuous fill material is preferably engineered to reduce the mechanical forces acting upon solder bumps 110 during temperature cycling. The continuous fill material 120 may be, for example, an epoxy compound including suspended particles (i.e., filler particles) of a thermally conductive and electrically insulating material (e.g., silica or alumina). The underfill material having the above properties can be realized in many forms available from possibly numerous vendors. Not to be limited to a particular form, one example of a suitable epoxy is Dexter HYSOL® No. 4527, a silica-filled epoxy (Dexter Electronic Materials, Industry, CA).

In FIG. 2, heatspreader 150 is shown in a cross-sectional view to be attached to integrated circuit 130 by thermally conductive material 140, which is preferably an adhesive epoxy. Thermally conductive material 140 may be introduced as a liquid encapsulant on top of IC 130 and then central portion of heatspreader 150 is arranged upon the liquid encapsulant and IC 130. The liquid encapsulant may be then subjected to a curing process as described above. Alternatively, thermally conductive material 140 may be a thermal grease. Heatspreader 150 consists of thermally conductive material, e.g., copper, and is designed to dissipate the heat generated from the integrated circuit 130. Typical heat dissipation requirements of a heatspreader may vary from about 5 to 30 watts per chip, depending on the application. Heatspreaders typically have bigger lateral dimensions than that of the IC's they are attached to in order to have an advantageously larger surface area for heat dissipation purposes. Thus, these heatspreaders are often referred to as "oversized." Prior art heatspeaders are typically attached and supported by a stiffener ring to the substrate, where the stiffener ring is typically a rectangular frame of copper which surrounds the IC. As discussed earlier in the Background of the Invention section, the installment of a stiffener ring may require a larger lateral area around the heatspreader than may be desired for a high density IC packaging application. The lateral dimensions of these prior art heatspreaders may be on the order of twice or more the size of the IC's they are thermally coupled to. A heatspreader used for the method and structure described herein may be of the order of, for example, only 1 ⅓ times as large as the IC it is to be attached to. For example, a 20 mm heatspreader might be coupled to a 15 mm IC die, which would translates into a significant reduction in such an embodiment of about 5 mm or more per lateral side of the heatspreader.

FIG. 3 depicts an embodiment of the integrated circuit structure 102 in which continuous fill material 160 surrounds the integrated circuit 130 and extends vertically between the substrate and overhanging lateral portions of heatspreader 150, which extend beyond the lateral edges of IC 130. Continuous fill material 160, preferably a thermosetting polymer such as an epoxy underfill, provides mechanical support to the "oversized" heatspreader. Continuous fill material 160 may be introduced as a liquid encapsulant between heatspreader 150 and substrate 100, and then may be subjected to curing process as described above. In an embodiment for which fill materials 160 and 120, and thermally conductive material 140 are all thermosetting materials, continuous fill material 160, continuous material 120, and thermally conductive material 140 may all be subjected to three individual curing process. In another such embodiment continuous fill material 160, continuous material 120, and thermally conductive material 140 may all be subjected to a single curing process. Or in yet another embodiment, the three materials may be subjected to a total of two curing processes.

Continuous fill material 160 preferably includes thermally conductive material. Thus, continuous fill material 160 provides a highly thermally conductive coupling to the heatspreader 150. Continuous fill material 160 may also include electrically conductive material, which could provide an effective grounding for the heatspreader 150 without any additional means in order to help reduce unwanted electromagnetic interference (EMI) effects. In an embodiment depicted in FIG. 3, continuous fill material 160, continuous fill material 120, and thermally conductive material 140 are three different materials each engineered for the specific requirements of its respective region, such as size, cost, mechanical function, thermal conductance, and electrical conductance. Alternatively, in another embodiment the continuous fill material 160 may be of similar composition as thermally conductive material 140. And in yet another embodiment, the continuous fill material 160, thermally conductive material 140, and continuous fill material 120 may all be of similar composition.

FIG. 4 depicts another embodiment of the integrated circuit structure 102, in which continuous fill material 170 fills the area between the central portion of heatspreader 150 and IC 130, and also surrounds the integrated circuit 130 and extends vertically between the substrate and overhanging lateral portions of heatspreader 150. Continuous fill material 170, preferably a thermosetting polymer such as discussed above for material 160, provides mechanical support to the "oversized" heatspreader 150 and also attaches the heatspreader 150 to both the substrate 100 and the IC 130. Preferably, continuous fill material 170 may be introduced as a liquid encapsulant on top of IC 130 and then the central portion of the heatspreader 150 is arranged upon the liquid encapsulant and IC 130. The liquid encapsulant is next introduced between the lateral overhanging portions of heatspreader 150 and substrate 100. These two continuous fill material 170 regions may be subjected to either one single or two individual curing processes as discussed above. Alternatively in another embodiment, continuous fill material 170 may be introduced on top of IC 130 and around IC 130 and on top of substrate 100. Heatspreader 150 is then centered over IC 130 and arranged upon the liquid encapsulant, which then may be subjected to a single curing process as discussed above. In an embodiment, continuous fill material 170, and continuous fill material 120, are subjected to different curing processes. In an another embodiment, the two thermosetting polymers are subjected to a single curing process. Continuous fill material 170 preferably includes thermally conductive material. Thus, continuous fill material 170 provides a highly thermal conductive coupling to the heatspreader 150 and IC 130. Continuous fill material 170 may also include electrically conductive material, and thus provide an effective grounding for the heatspreader 150 and help reduce unwanted electromagnetic interference (EMI) effects.

FIG. 5 depicts another embodiment of integrated circuit structure 102, in which continuous fill material 180 fills in the three regions between IC 130 and substrate 100, between the central portion of heatspreader 150 and IC 130, and between substrate 100 and overhanging lateral portions of heatspreader 150 that surround IC 130. Continuous fill material 180, preferably a thermosetting polymer such as an epoxy underfill similar to materials 160 and 170 discussed above, provides mechanical support to the "oversized" heatspreader 150 and IC 130. It surrounds the solder bumps attaching 130 to substrate 100, and attaches heatspreader 150 to both substrate 100 and IC 130. Continuous fill material 180 may be introduced piecemeal into the package structure as a liquid encapsulant first between IC 130 and substrate 100 as discussed for continuous fill material 120. In an embodiment the liquid encapsulant may be then subjected to a curing process as discussed above. Next the liquid encapsulant may be introduced into the other two regions as was discussed in the embodiments for continuous fill material 170. Furthermore, the liquid encapsulant may be then subjected to one or two curing processes as given in the above embodiments as discussed for continuous fill material 170. Alternatively in another embodiment, all curing processes are suspended until the total introduction of the liquid encapsulant in all three regions is completed, and then the total liquid encapsulant may be subjected to one single curing process as discussed above. In yet another embodiment, the liquid encapsulant may be introduced in the region between IC 130 and substrate 100 and in the region between the IC 130 and heatspreader 150, where then both regions may be subjected to a curing process as discussed above. In the same embodiment, the liquid encapsulant is further introduced into the region between substrate 100 and overhanging lateral portions of heatspreader 150, which may be then subjected to a curing process as discussed above. Continuous fill material 180 preferably includes thermally conductive material. Thus, continuous fill material 180 allows for the use of a highly thermal conductive coupling between heatspreader 150, IC 130 and substrate 100. Continuous fill material 180 does not include electrically conductive material in this embodiment, since it encapsulates solder bump connections 110. The use of one continuous fill material 180 as shown in FIG. 5 may reduce the manufacturing complexity of attaching a heatspreader to an IC flip-chip mounted to a substrate.

It will be appreciated to those skilled in the art having the benefit of this disclosure that this invention is believed to provide a IC flip-chip package structure combining an integrated circuit which is flip-chip mounted to a substrate with an underfill supported heatspreader, and a method for forming such a structure. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for packaging an integrated circuit which is flip-chip mounted to a substrate, said method comprising introducing a first liquid encapsulant laterally surrounding the integrated circuit, wherein the first liquid encapsulant is adapted to provide mechanical support for a heatspreader upon curing.

2. The method of claim 1, wherein the first liquid encapsulant comprises thermally conductive adhesive material.

3. The method of claim 1, wherein the first liquid encapsulant comprises thermally and electrically conductive adhesive material.

4. The method of claim 1, further comprising attaching the heatspreader to the integrated circuit with a thermally conductive material.

5. The method of claim 4, wherein the thermally conductive material is of similar composition as the first liquid encapsulant.

6. The method of claim 4, wherein the thermally conductive material is of the same composition as the first liquid encapsulant.

7. The method of claim 6, wherein said introducing further comprises dispensing the encapsulant over the integrated circuit, and wherein said attaching is performed subsequent to said introducing.

8. The method of claim 6, further comprising subjecting the thermally conductive material and the first liquid encapsulant to a single curing process.

9. The method of claim 4, further comprising introducing a second liquid encapsulant between the integrated circuit and the substrate.

10. The method of claim 9, wherein the second liquid encapsulant and the thermally conductive material are of similar composition as the first liquid encapsulant.

11. The method of claim 10, wherein the second liquid encapsulant and the thermally conductive material are of the same composition as the first liquid encapsulant.

12. The method of claim 11, further comprising subjecting the second liquid encapsulant, the thermally conductive material, and the first liquid encapsulant to a single curing process.

13. The method of claim 1, wherein the substrate comprises a circuit board.

14. The method of claim 1, wherein the substrate comprises a packaging substrate.

15. The method of claim 14, wherein the substrate comprises a multichip module substrate.

* * * * *